United States Patent
Stone et al.

(10) Patent No.: US 9,075,933 B2
(45) Date of Patent: Jul. 7, 2015

(54) 3D TRANSFORMATION OF OBJECTS USING 2D CONTROLS PROJECTED IN 3D SPACE AND CONTEXTUAL FACE SELECTIONS OF A THREE DIMENSIONAL BOUNDING BOX

(71) Applicant: Adobe Systems Incorporated, San Jose, CA (US)

(72) Inventors: William Aamir Stone, Seattle, WA (US); Todd Michael Groner Kopriva, Seattle, WA (US)

(73) Assignee: Adobe Systems Incorporated, San Jose, CA (US)

( * ) Notice: Subject to any disclaimer, the term of this patent is extended or adjusted under 35 U.S.C. 154(b) by 342 days.

(21) Appl. No.: 13/649,930

(22) Filed: Oct. 11, 2012

(65) Prior Publication Data

US 2014/0104266 A1    Apr. 17, 2014

(51) Int. Cl.
*G06F 17/50* (2006.01)
*G06T 17/00* (2006.01)
*G06T 19/00* (2011.01)

(52) U.S. Cl.
CPC .................................... *G06F 17/50* (2013.01)

(58) Field of Classification Search
CPC ....... G06T 17/10; G06T 17/00; G06T 7/0046; G06T 19/00; G06T 19/20; G06T 2219/2016; G06T 13/20; G06T 3/0006; G06T 7/2046; G06T 2210/12; G06F 17/50; G06F 3/04845
See application file for complete search history.

(56) References Cited

U.S. PATENT DOCUMENTS 5,588,098 A * 12/1996 Chen et al. ..................... 345/653
5,842,473 A * 12/1998 Fenster et al. ................. 600/445
2012/0078589 A1* 3/2012 McDaniel ........................ 703/1

OTHER PUBLICATIONS

Visit User's Manual, Lawrence Livermore National Laboratory, Oct. 2005.*

* cited by examiner

*Primary Examiner* — Kee M Tung
*Assistant Examiner* — Haixia Du
(74) *Attorney, Agent, or Firm* — Kilpatrick Townsend & Stockton LLP

(57) ABSTRACT

Systems and methods are provided that allow a user to intuitively and efficiently manipulate one or more three-dimensional (3D) objects in a 3D space by performing at least one of a rotation transformation, a translation transformation, and a scaling transformation. A bounding box is presented encompassing the one or more 3D objects, as well as an anchor point. A user may select a face of the bounding box to establish a plane of transformation. Based upon the established plane of transformation, the dimensionality of possible transformations is automatically determined. Thereafter, a user may drag a handle or selected face of the bounding box, and the transformation is performed in accordance with the drag and relative to the location of the anchor point in the direction of the selected face.

22 Claims, 11 Drawing Sheets

US 9,075,933 B2

3D TRANSFORMATION OF OBJECTS USING 2D CONTROLS PROJECTED IN 3D SPACE AND CONTEXTUAL FACE SELECTIONS OF A THREE DIMENSIONAL BOUNDING BOX

TECHNICAL FIELD

The technical field of the present disclosure relates to computer-implemented methods and systems of graphical object processing in a three-dimensional (3D) space.

BACKGROUND

Two-dimensional (2D) computer graphics refers to the computer-based generation of digital images from 2D models, e.g., text, digital images, etc., based upon a 2D representation of geometric data. Manipulating 2D media, such as a digital image representing text, may involve manipulation, via, e.g., a graphical media editing/creation tool, in the XY plane. That is, 2D media may be modified and/or manipulated by 2D geometric transformations. Transformations in the mathematical sense refer to any function mapping a set X on to another set/to itself, where the set X may have additional algebraic or geometric structure. Examples of transformations include, but are not limited to rotation, scaling, and translation. Thus, from a computer graphics perspective, the transformation of a 2D object may involve one or more of the following: "rotating" or spinning the 2D object around a fixed point in the XY plane; "scaling" or enlarging/diminishing the 2D object by the same scale factor in the X and Y directions; and "translating" or moving every point of the 2D object by some fixed distance in the same direction within the XY plane.

In contrast, 3D computer graphics utilize a 3D representation of geometrical data, where, in addition to having a width and height and being manipulatable along the X and Y axes, an object has depth or a third dimension known as the Z axis. Accordingly, manipulating 3D graphical objects, such as effectuating transformations, involves one or more of the X, Y, and Z axes. Controlling the direction of transformations in 3D space requires identifying a subset of at most, two axes (i.e., X and Y, Y and Z, or X and Z) of the three possible axes to operate on. This is because most conventional control devices (e.g., computer mice, or touch screens) only operate in 2D, i.e., the X and Y axes.

Performing transformations on objects in a graphical media editing/creation tool may be based upon a bounding box. In geometry, a bounding box refers to a minimum/smallest or enclosing box within which all points of an object(s) lie. In the context of computer graphics, a bounding box may be thought of as a rectangular border around, e.g., an image, shape, or text, that a user may metaphorically utilize to perform a transformation. That is, a user may drag an edge or control point located at the corners or center of edges (known as a handle) of a bounding box to translate, scale, or rotate an object or perform various custom manipulations such as skew, changing the extrusion depth or bevel settings, or other geometric deformations, etc.

BRIEF DESCRIPTION OF THE DRAWINGS

For a more complete understanding of example embodiments of the present disclosure, reference is now made to the following descriptions taken in connection with the accompanying drawings in which.

DETAILED DESCRIPTION

Figure 1:
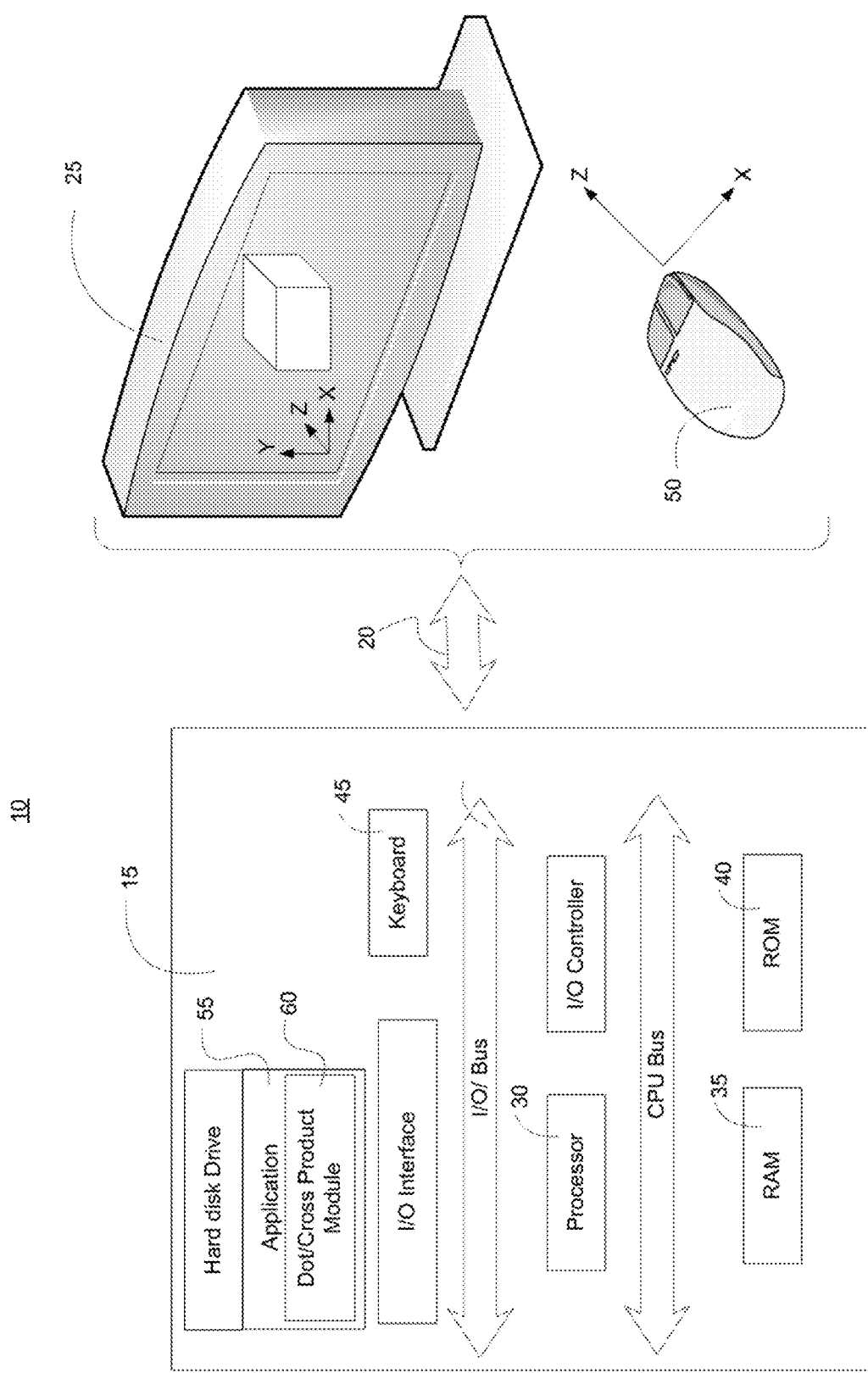
FIG. 1 is an exemplary representation of a computer system in which various embodiments may be implemented.

In prior graphical media editing/creation tools, there is no convenient and efficient method of determining the dimension of transformation (i.e., width, height, or depth) since conventional tools do not have "true" 3D bounding boxes. For example, when dealing with a 3D bounding box in a conventional graphical media editing/creation tool, clicking and dragging a corner handle to scale an object could mean a scale in either the XY plane, the XZ plane, or the YZ plane. Likewise, similar confusion exists for rotation where a corner handle can be ambiguous as to which direction an object layer should be rotated. Rather, conventional graphical media editing/creation tools only deal in 2D planes in space, and thus, a simple X and Y axes association would be sufficient to define a transform on such a 2D or flat bounding box. Moreover, conventional tools and methods employ inefficient and/or un-intuitive interfaces for effectuating transformations that may be error-prone in practice. For example, when transformations are tied to an anchor point, and if an object's anchor point is out of the way or out of view, there is no easy way of modifying the object without first locating that anchor point in the tool view.

Additionally, performing a drag or moving a handle in one plane to scale or move the object in another plane is not intuitive to any user that does not understand normal vectors, or does not have a mathematical background. Further still, conventional systems that attempt to intuit a user's intent by a user's drag action, small drags or closely aligned dimensions often result in erroneous transformations.

Systems and methods are provided that allow a user to manipulate a 3D object directly and intuitively using a graphical media editing/creation tool in accordance with various embodiments of the present disclosure. That is, a user may perform transformation operations, e.g., rotation, translation, and scaling, of an object in 3D space such that the transformation operations are performed in line with the movement of a control device (e.g., mouse, touch input on a screen, etc.), and where the transformation of the object intuitively follows, e.g., a cursor, representative of the control device movement. Manipulating objects in accordance with various embodiments of the present disclosure is a much easier process and is more easily understood than with conventional systems and methods.

In operation, a graphical media editing/creation tool in accordance with various embodiments of the present disclosure presents a manipulation interface that may take the form of, e.g., bounding box about one or more 3D objects that a user intends to transform, a mesh overly covering a 3D model, etc. Additionally, an anchor point may be presented at some default location relative to the one or more 3D objects, where the anchor point is indicative of an origination point of the intended transformation. Alternatively, the anchor point may be set by the user relative to the one or more 3D objects. The user may further select or specify a face of the bounding box, mesh overlay, etc. Once the anchor point and selected face have been set, and through the use of dot and cross product calculations, the graphical media editing/creation tool automatically determines what direction(s) the intended transformation may occur in. Thereafter, the intended transformation may be performed in accordance with the amount and direction(s) the user drags a handle of the manipulation interface.

As utilized herein, the term "bounding box" refers to a cuboid structure/figure that encloses all the geometry of one or more 3D objects. As utilized herein, the term "rotation" refers to movement about a fixed anchor point such that every point in one or more 3D objects within a bounding box turns about the anchor fixed point through the same angle. As utilized herein, the term "translation" refers to shifting every point in one or more 3D objects within a bounding box in the same three-dimensional direction, and by the same distance/amount. As utilized herein, the term "scale" or "scaling" refers to increasing or diminishing the distance between every point in one or more 3D objects within a bounding box to a fixed anchor point by some factor that is the same in any/all relevant directions.

Manipulation of one or more objects in 3D space involves, at a high-level, presenting a bounding box around one or more 3D objects, setting an anchor point, defining a drag, and then performing a transformation. Defining a drag involves selecting a face of a bounding box around the 3D object, automatically determining the dimensionality of a desired transformation by utilizing the plane defined by the selected face as a guide to intuit the directions of possible transformations, and sensing the dragging of a handle. Thereafter, the transformation is performed in accordance with the defined drag and relative to the location of the anchor point. It should be noted that more than one transformation may be performed at any one time in the sense that a user may choose to lock transformation axes together such that translating or scaling along two axes may occur at the same time and by the same amount.

As previously indicated, a bounding box refers to a border surrounding one or more objects. In the case of various embodiments of the present disclosure, a bounding box is a 3D box surrounding one or more 3D objects. A bounding box in accordance with various embodiments of the present disclosure has six faces representative of the following areas of the bounding box: "top;" "bottom;" "front;" "back;" "left" side; and "right" side. However, and in accordance with other embodiments of the present disclosure, other mechanisms, besides the use of bounding boxes, may be used to define a face. For instance, if a 3D model is the object to be transformed, any face on that 3D model can be used to infer a plane for the directionality of transformation as described herein.

Associated with a bounding box are one or more drag handles. A drag handle refers to an edge or one or more points along an edge of a bounding box that may be manipulated by a user to effectuate transformation of the one or more 3D objects. Alternatively, and in the case of a translation transformation, a drag handle may be a point on a face of the bounding box. That is, a user may, e.g., click and drag a handle to control how the one or more 3D objects are to be transformed, i.e., the amount of transformation, and the direction(s) of transformation.

Depending on a defined perspective view(s) or camera angles associated with/used to view the 3D space occupied by the 3D object, the axes associated with the aforementioned faces may be altered or defined in a variety of ways. For the purposes of describing various embodiments of the present disclosure disclosed herein, the top and bottom faces may be considered to define XZ planes, the front and back faces may be considered to define XY planes, and the left and right side faces may be considered to define YZ planes. It should be noted, however, that any arbitrary plane in an XYZ space defined by a normal vector can be used, for example, any face defined by a 3D model.

An anchor point is considered to be a point, associated with an object or group of objects, from where a transformation originates. For example, if an anchor point is set at the center of a 3D object, the desired transformation of all points on that 3D object are scaled relative to that anchor point and proceed outwards (enlarging) or inwards (diminishing). As another example, if an anchor point is set along a particular edge of a bounding box defined about a 3D object, and rotation is the desired transformation, rotation will occur around that particular edge of the bounding box.

It should be noted that an anchor point may be set or located away from the 3D object itself instead of having an anchor point located, e.g., within the 3D object or on a border/edge of the bounding box defined about the 3D object. In this instance, a transformation, e.g., rotation, will occur about the remotely located anchor point.

Once a face of a bounding box, or an arbitrary face on an object(s) mesh overlay has been selected, a plane defined by the selected face operates to automatically determine the dimensionality of the desired transformation. That is, the plane or axis/axes in which the desired transformation has a possibility of occurring is determined. To accomplish this determination of dimensionality, the normal vector of the face is used to find a plane in space. As described previously, the normal vector of the face refers to a line or vector that is perpendicular to that face. In the context of a 3D bounding box of the present disclosure, the normal vector is the vector perpendicular to the plane defined by the selected face. Thus, determining the normal vector to the selected face allows the "plane of transformation" to be set as each bounding box face or mesh face will have a different normal vector. Setting the plane of transformation provides a reference for the transformation. For example, a cursor (controlled by a mouse) location in the XY screen space (if the selected face is, e.g., the front face of the bounding box) is projected onto that XY plane during a mouse drag to determine a distance/value(s) to transform the 3D object(s) in the XY plane.

Depending on which face is selected, dimensionality may be defined as either a single defined axis or two defined axes. For example, a user may wish to scale up a 3D object in either the X plane (i.e., increase the width of the 3D object) or the Y plane (i.e., increase the height of the 3D object). Alternatively, the user may wish to scale up the 3D object in both the X and Y planes, such that the width and height of the 3D object are simultaneously increased.

To determine the single defined axis or the two defined axes that define dimensionality, dot and cross products of the selected handle point, the normal vector of the selected face, as well as the selected face are used to determine which axis/axes they are. In mathematics, the cross product or vector product refers to a binary operation on two vectors in 3D space that results in a vector which is perpendicular to both of the vectors being multiplied, and therefore, normal to the plane containing them. Therefore, the cross product algorithm may determine the aforementioned normal vector that is used to set the plane of transformation.

In mathematics, the dot product or scalar product refers to an algebraic operation that takes two number sequences of equal length, e.g., coordinate vectors, and returns a single number calculated by multiplying the corresponding entries and summing those products. In contrast to the cross product, the dot product produces a scalar value, rather than a vector, where the dot product is directly related to the cosine of the angle between two vectors. Practically speaking, the dot product is a projection of one vector onto another vector. In accordance with various embodiments of the present disclosure, the dot product algorithm is utilized to calculate which direction(s)/axis or axes are allowed to be changed depending on the selected face and the type of transformation to be performed.

The method and resultant "table" of associations for determining the single defined axis or two defined axes is as follows.

For a scale transformation, a handle direction vector is determined. That is, for the front, back, top, and bottom faces of a bounding box, or any arbitrary face in a mesh, scaling along the X axis is allowed only if the handle direction from the center of the bounding box dotted with the x direction is non-zero. For the front, back, left, and right faces of the bounding box, scaling along the Y axis is allowed only if the handle direction from the center of the bounding box dotted with the y direction is non-zero. For the top, bottom, left, and right faces of the bounding box, scaling along the Z axis is allowed only if the handle direction from the center of the bounding box dotted with the z direction is non-zero.

For a rotation transformation, again, the handle direction vector is determined. Then, the normal vector of a selected face of a bounding box is determined. Further still, it is determined whether the dot product of the selected face normal vector crossed by the X, Y, and Z vectors is non-zero. These determinations allow the graphical editing/creation tool to decide if it is possible to rotate in one or more of the X, Y, and Z directions respectively. If only one of these values are non-zero, the handle corresponds to an edge of the bounding box that may be safely used as the rotation dimension. If rotation is possible in more than one direction, it may be assumed that the handle is a corner handle, and the face normal is used as the rotation axis. To determine the corner handle rotation axis the dot product of the face normal and the X, Y, and Z vectors is calculated, and if the result is a non-zero value, the corresponding axis is the axis of rotation, and the rotation will be about that face normal vector.

For a translation transformation, methods similar to that described above may be used to determine along which axis/axes one or more 3D objects within a bounding box are to be moved. In particular, the direction of translation is determined by taking the dot product of the face normal with the X, Y, and Z direction, and the one result that is equal to zero is the dimension that is not allowed for the transformation.

When corner points of a bounding box are selected as handles, the following operations result depending on what bounding box face is selected. If the top or bottom face of a bounding box is selected, the corner points would rotate about the Y axis, while scaling and translation would occur in the XZ plane. If the front or back face of a bounding box is selected, the corner points would rotate about the Z axis, while scaling and translation would occur in the XY plane. When the left or right face of a bounding box is selected, the corner points would rotate about the X axis, and scaling and translation would occur in the YZ plane.

When edge center points of a bounding box are selected as handles, the following operations result depending on what bounding box face is selected. If the top or bottom face is selected, the front and back edge handles scale along the Z axis and rotate about the X axis while the left and right edge handles scale along X axis and rotate about the Z axis. If the front or back face is selected, the top and bottom edge handles scale along the Y axis and rotate about the X axis, whereas the right and left edge handles scale along the X axis and rotate about the Y axis. If the right or left face is selected, the top and bottom handles scale along the Y axis, and rotate about the Z axis, whereas the front and back edge handles scale along the Z axis and rotate about the Y axis.

It should be noted that utilization of the dot and cross product algorithms avoids the need to hard code the aforementioned associations/determinations in the digital media editing/creation tool, although hard coding such data may be done.

When a user drags a handle, the drag direction(s) (and amount(s) as will be discussed) are sensed and passed to the graphical media editing/creation tool. A transformation may then be performed based on the direction of that plane relative to where the anchor point is located. For example, clicking on the top or bottom face of a bounding box, and dragging a corner point will scale one or more 3D objects in the bounding box in the X and Z directions (in local coordinates) of that bounding box. However, selecting the front or back face of the bounding box, and dragging that same handle will result in scaling along the X and Y axes. Similarly, selecting the left or right face of the bounding box, and modifying/manipulating the same handle will result in scaling along the Y and Z axes.

Center handles, which refer to handles located in the center of a bounding box edge, may operate in one of two possible dimensions, where the same handle may be used for different transformations depending on what face of the bounding box is selected. For example, selecting the top face and modifying a middle horizontal center handle will scale in the Z direction, whereas with the front face selected, that same center handle will scale in the Y direction. The same happens with rotation about corner points/handles. With the front or back face of a bounding box selected, a corner rotation will rotate about the Z axis. However with the top face of the bounding box selected, a corner rotation will rotate about the Y axis. Likewise, and for a left or right side face of the bounding box, corner rotation occurs about the X axis. It should be noted that in general, corner point rotation occurs about the normal vector of a selected face of the bounding box, and edge handles tilt the face about the line that is perpendicular to the handle and lies within the face.

Again, translation may be achieved in a similar manner (if a translation would need to be constrained to two axes). For example, movement of each of the drag handles is capable of effectuating the translation in multiple dimensionalities depending on the plane defined by the selected face. Alternatively, and instead of translating in a direction of the projected camera film plane (for X and Y movements of a mouse), the X and Y directions of the selected face can be used. The mouse (or other input mechanism, e.g., finger) movement can be projected onto that plane to get very intuitive movements, which may be essential for sliding one or more objects along a ground plane, for example, or up the side of a wall, etc.

Once the correct directions have been determined as described, the one or more 3D objects within the bounding box may be rotated, translated or scales according to the determined direction(s) and by the determined/sensed amount. It should be noted that the amount of transformation to be performed may depend on localized settings of the mouse or other control mechanism. It should be further noted that although various embodiments of the present disclosure have been described in the context of utilizing a mouse or touch screen that operates in a 2D space, other embodiments contemplate use of computer mice or control devices configured to operate in a 3D space, providing even more intuitive user control. For instance, a 3D mouse input can be used to project transformation to the face directly. That is, input coordinates may be translated to selected face coordinates.

As previously indicated, a graphical media editing/creation tool is utilized to manipulate one or more 3D objects in accordance with various embodiments of the present disclosure. Such a tool may be implemented as a software feature within a broader application, such as Adobe® After Effects® that is executed on a computer or processor-controlled device. FIG. 1 is an exemplary representation of a computer system 10 in which various embodiments may be implemented. The computer system 10 includes one or more computers 15, a communications bus 20, and a display device 25. Computer 15 can be a personal computer, workstation, or other processor-controlled device, and it may be local to the user performing the editing or remote from the user. For example, the computer system 10 may include a server computer communicating with a client computer. Computer 15 may include one or more processors 30, a memory bus, random access memory (RAM) 35, read only memory (ROM) 40, peripherals. The peripherals may include a keyboard 45, and/or other input devices, e.g., a pointing device, such as a mouse 50, etc., that may be utilized to effectuate selection and/or manipulation/transformation actions of the user described herein. Still other peripherals may include storage devices, e.g., floppy disk drive, hard disk drive, flash memory unit, etc. (not shown). The storage devices typically include an operating system and one or more applications including the tool/application 55 described herein, the tool including one or more modules for implementing the aforementioned features, e.g., module 60 for accessing/executing the dot and cross product algorithms.

As further illustrated in FIG. 1, the mouse 50 may be operable in the XZ plane, e.g., on the surface of a desk. However, and as previously described in accordance with various embodiments, a user may perform transformation operations of an object in 3D space (as displayed on display device 25) such that the transformation operations are performed in line with the movement of the mouse 50, and where the transformation of the object intuitively follows movement of the mouse 50. That is, a cursor controlled by movement of the mouse 50 in a physical XZ plane may be projected onto a desired plane of transformation during a mouse drag to transform the object in the XY plane, for example.

Figure 2:
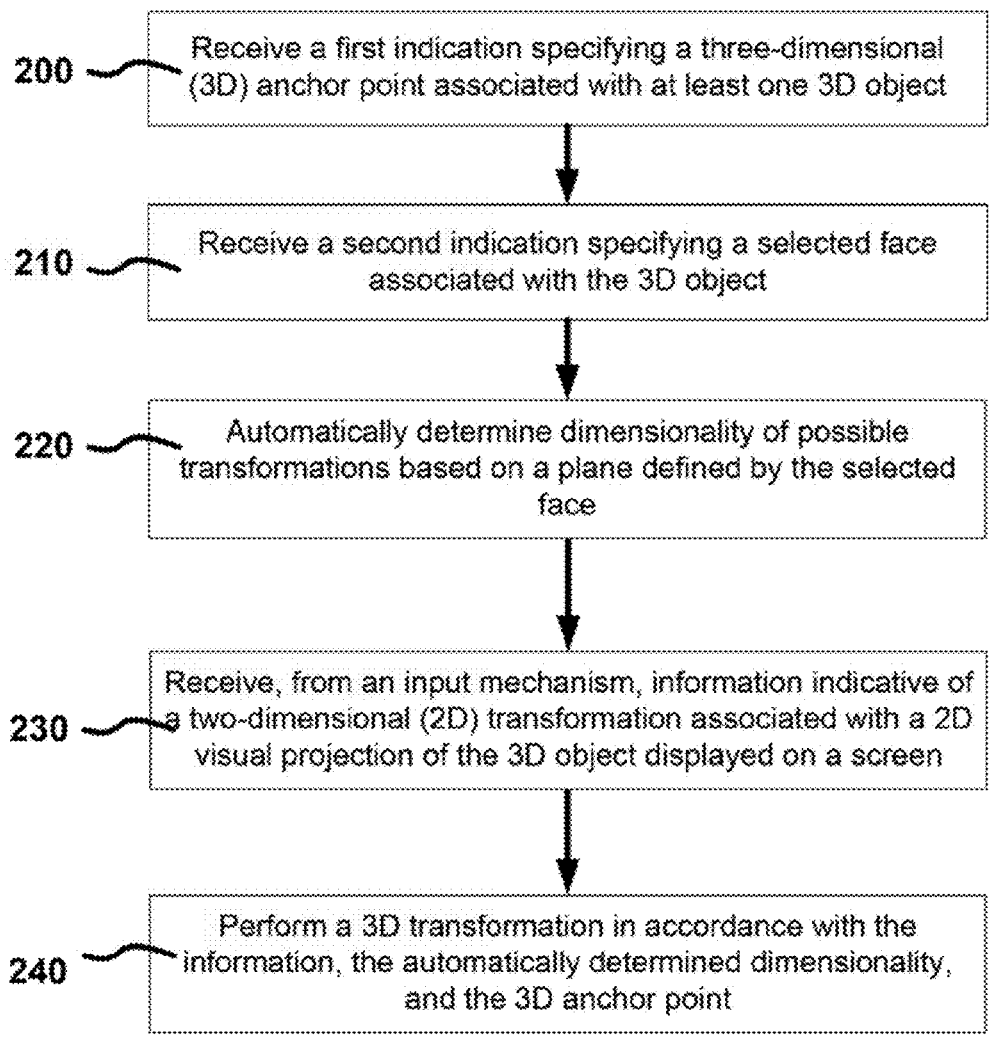
FIG. 2 is a flow chart illustrating a process in accordance with an embodiment of the present disclosure.

FIG. 2 illustrates an exemplary flow chart of processes performed to effectuate the manipulation of one or more 3D objects in accordance with various embodiments of the present disclosure. At 200, a first indication specifying a 3D anchor point associated with at least one 3D object is received. As described previously, a user may move the anchor point associated with an object to alter the starting or reference point for a desired transformation. Additionally, the anchor point may be presented in a predefined or default position. Next, a 2D drag operation may be defined, as described previously, involving processes 210-230. At 210, a second indication specifying a selected face associated with the 3D object is received. Again and as previously described, a user may choose any face he/she desires in order to set the plane of transformation. As also previously described, a 2D visual projection of a bounding box may be presented about at least one 3D object, where a graphical media editing/creation tool in accordance with various embodiments of the present disclosure may automatically generate such a bounding box for, e.g., each layer of a composition. That is, a first text box may comprise one layer, a second text image may comprise another layer, and an image may comprise yet another layer, and so on, where the first and second text boxes as well as the image make up the composition. Thus, when a user wishes to manipulate an object, in this exemplary scenario, a layer, the user may move a cursor over the desired object, and a bounding box may be presented about that desired object. Alternatively, and in accordance with other embodiments of the present disclosure, a user may select multiple objects (e.g., layers) of a composition to be constrained by the same bounding box. In this instance, manipulation would be determined and performed for each object in the bounding box according to the methods and techniques described previously, based in part, upon selection of a face of the bounding box. Alternatively still, and if, e.g., a 3D model is used, any face of that 3D model may be selected instead of utilizing a bounding box. At 220, the dimensionality of possible transformations is automatically determined based on a plane defined by the selected face as described herein using, e.g., dot and cross product algorithms. At 230, information, from an input mechanism, e.g., mouse, touch input, etc., indicative of a 2D transformation associated with a 2D visual projection of the 3D object (or the bounding box if present) displayed on a screen is received. That is, the user may perform an action, such as a handle drag to effectuate a desired transformation, where the action is sensed and translated into instructions to be followed by the graphical media editing/creating tool for performing the desired transformation. At 240, the 3D transformation is performed in accordance with the received information, the automatically determined dimensionality, and the 3D anchor point.

Figure 3A:
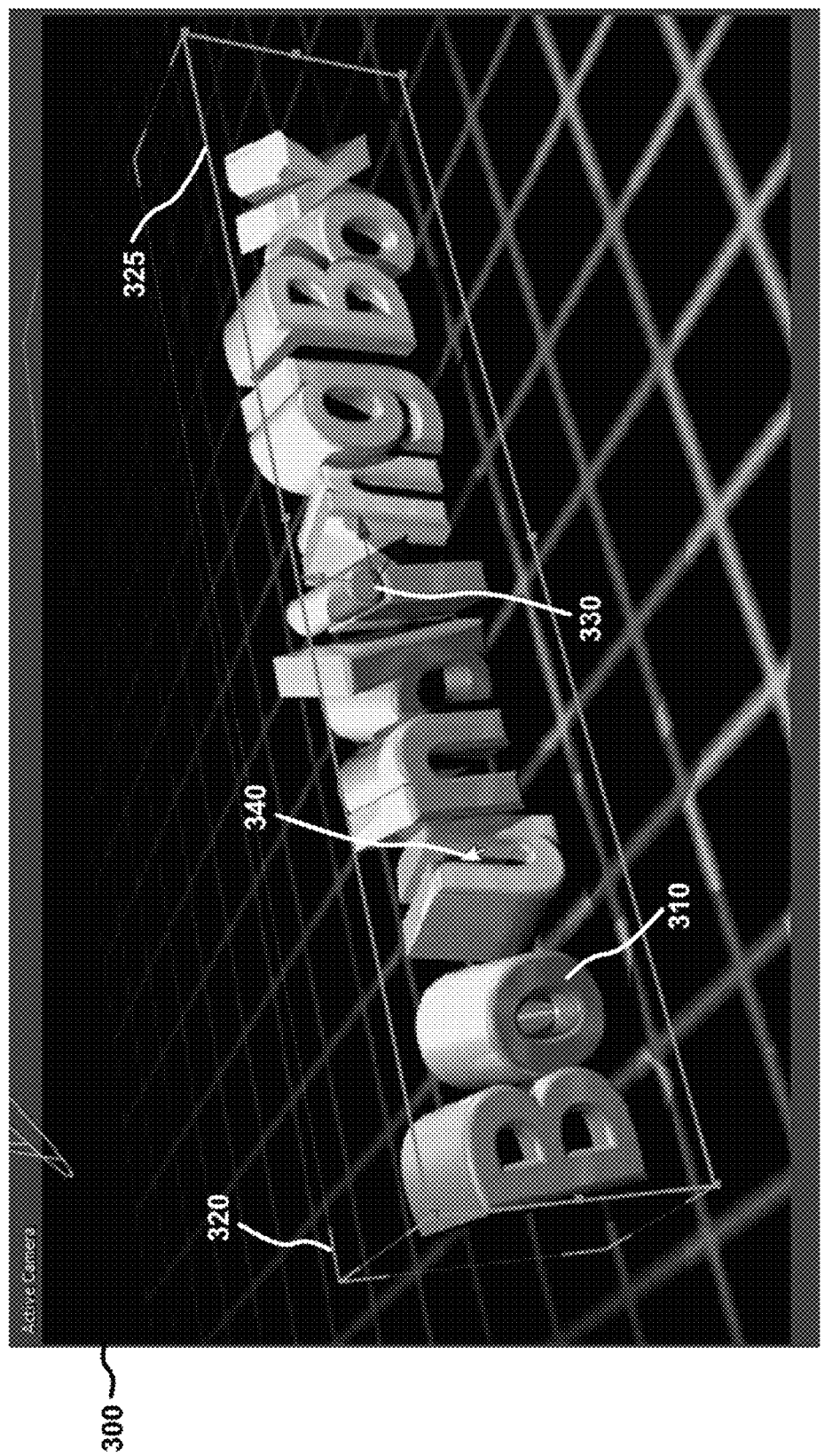
FIGS. 3A and 3B illustrate an exemplary graphical media editing/creation tool user interface displaying a moveable anchor point in accordance with various embodiments.

In order to allow a user to manipulate one or more 3D objects in accordance with various embodiments, the graphical media editing/creation tool may present a user interface (UI) to the user, through which the user may control and view/preview any manipulations. As previously described, a bounding box is presented about one or more 3D objects, as well as an anchor point from where a desired transformation originates. FIG. 3A illustrates an exemplary graphical media editing/creation tool UI in accordance with various embodiments of the present disclosure. In FIG. 3A, a workspace 300 shows a 3D object 310 in the form of 3D text. Surrounding the 3D object 310 is a bounding box 320. Additionally, an anchor point 330 is shown, where the anchor point 330 presents the X, Y, and Z axes relative to the 3D object 310. A cursor 340 is further displayed, the cursor 340 being representative of movement and/or action by a user performed through a mouse or other control mechanism. In this example, the cursor 340 is shown as selecting the plane of transformation, i.e., front face 325 of the bounding box 320. As shown in FIG. 3A, a selected face, e.g., front face 325, may be highlighted or otherwise visually identified to a user, for example, by being outlined with another color, being identified with a solid and/or bolded line while unselected faces are outlined with a broken/hash/dotted line, etc. It should be noted that a particular face, e.g., a front face, may be set as a default plane of transformation, such that the exemplary graphical media editing/creation tool UI appears to a user with the front face already selected.

Figure 3B:

FIG. 3B illustrates the graphical media editing/creation tool UI of FIG. 3A, except instead of having the anchor point 330 within or otherwise tied to the bounding box 320, the anchor point 330 has been positioned by the user away from the bounding box 320 so that any transformations will occur about the remotely located anchor point 330. It should be noted that an anchor point of a bounding box may be "snapped to" some desired portion of the bounding box, e.g., a corner or border of the bounding box, as an assistive measure for users.

It should be noted that the cursor 340 may be presented in the workspace 300 in the form of a particular icon, e.g., a translation, rotation, or scale icon, instead of the default arrow to signify that the transformation to be applied will be a translational, rotational or scale transformation in the x, y or z direction defined by the selected face. Still other icons may be utilized to represent the cursor 340 depending upon the type of transformation to be effectuated, or alternatively, the icon may remain the same.

Figure 4:
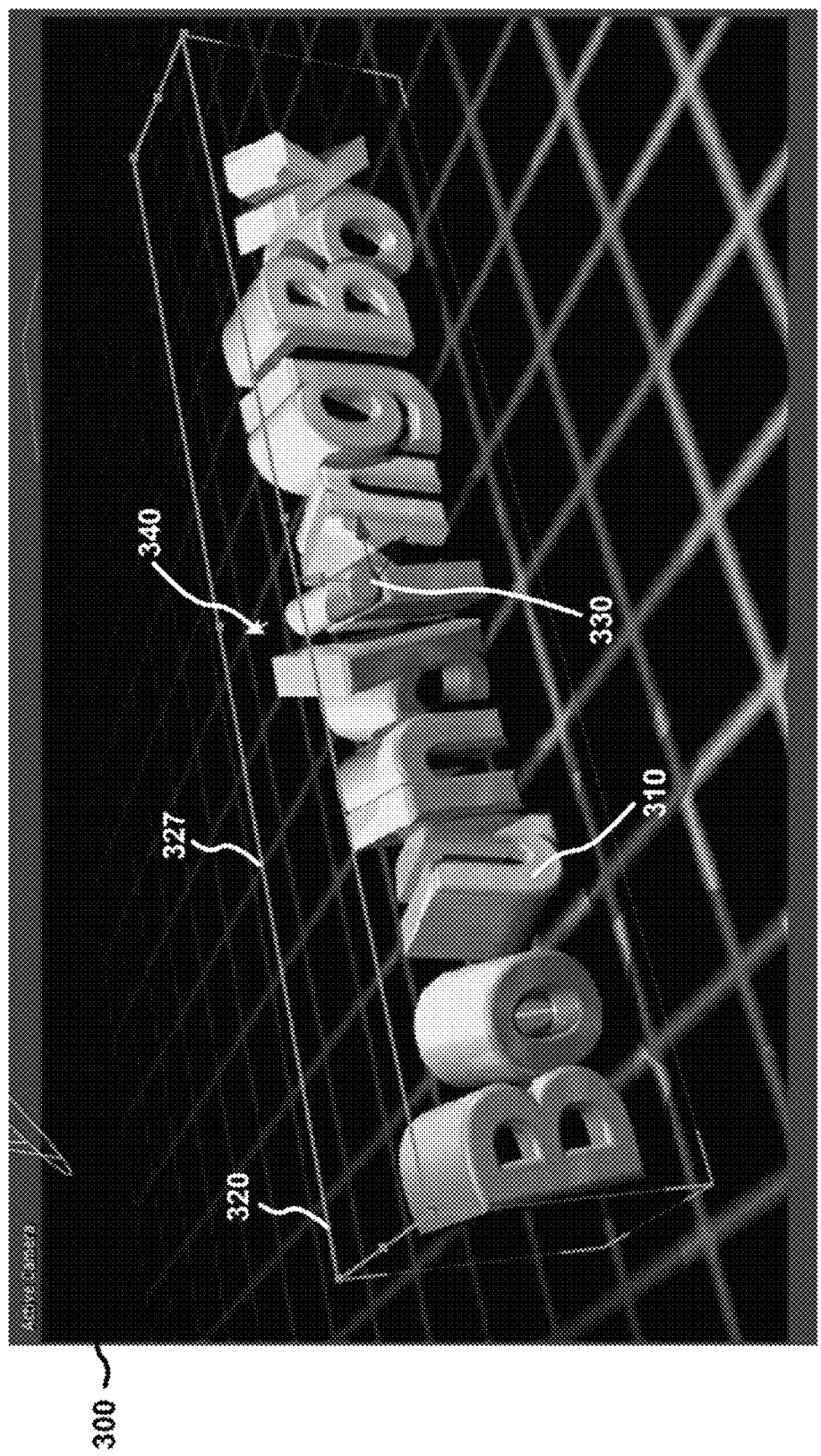
FIG. 4 illustrates an exemplary graphical media editing/creation tool user interface displaying bounding box face selection in accordance with various embodiments.

FIG. 4 illustrates the graphical media editing/creation tool UI of FIG. 3A, where a user has selected the plane of transformation to be the top face 327 of the bounding box 320. As shown in FIG. 4, the selected face 327, is identified by a solid, bold line, having been selected by the user positioning the cursor 340 thereon.

FIGS. 5A-5F illustrate exemplary transformations effectuated in accordance with various embodiments of the present disclosure.

Figure 5A:
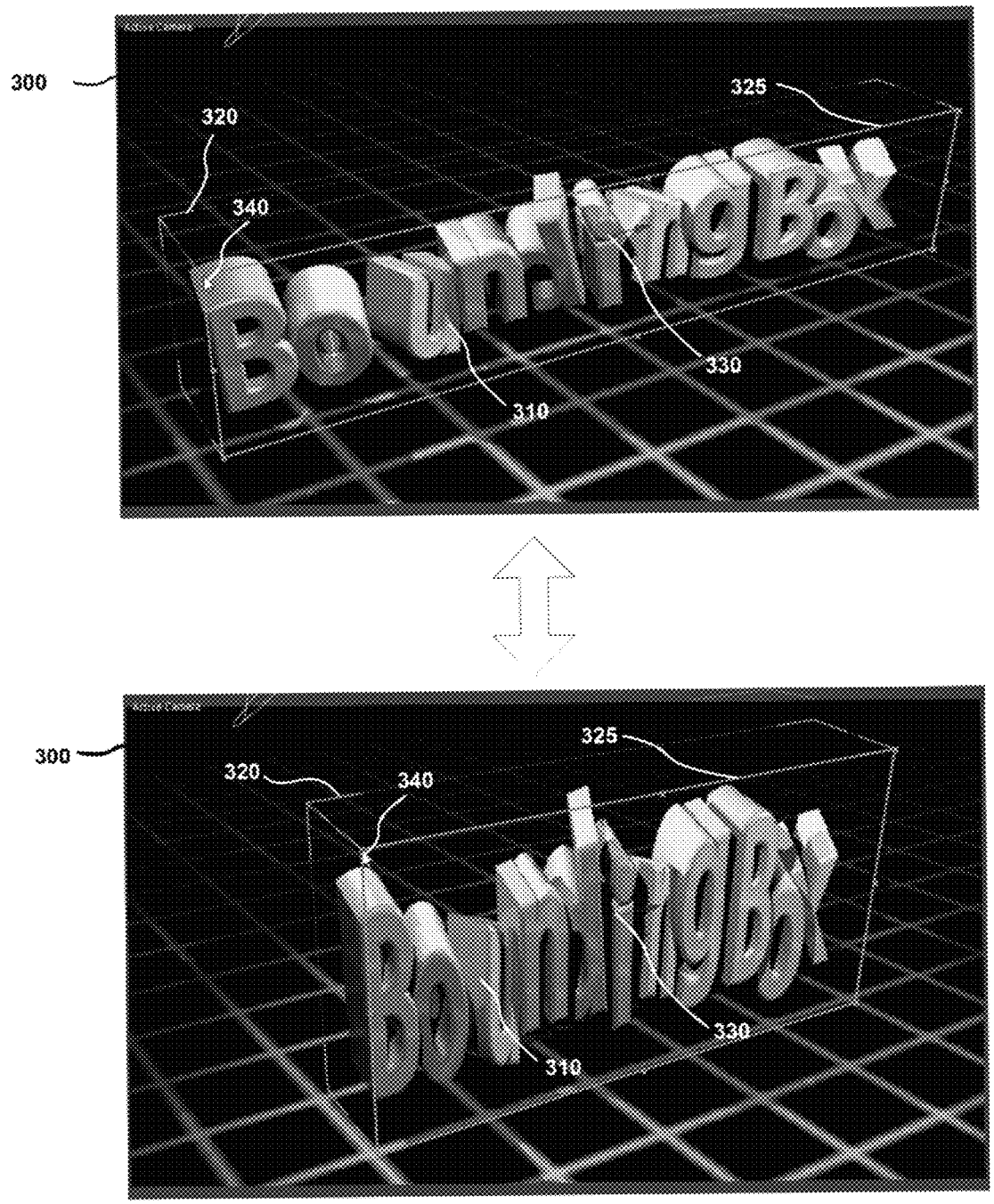
FIGS. 5A and 5B illustrate exemplary scaling transformations of a 3D object in accordance with various embodiments

FIG. 5A illustrates an exemplary scale transformation. Again, the workspace 300 of the graphical media editing/creation tool UI of FIG. 3A may display a 3D object 310 in the form of 3D text. In this instance, the selected face 325 of the bounding box 320 is the front face. Thus, a user may drag a handle, such as a center handle, corner, etc. associated with the selected face of the bounding box, mesh overlay, etc. and perform a desired transformation. In this example, a user has selected the top left front corner associated with the front face 325 using the cursor 340 to, in this example, increase the scale of the 3D object 310 in the Y direction and decrease the scale of the 3D object 310 along the X axis.

Figure 5B:
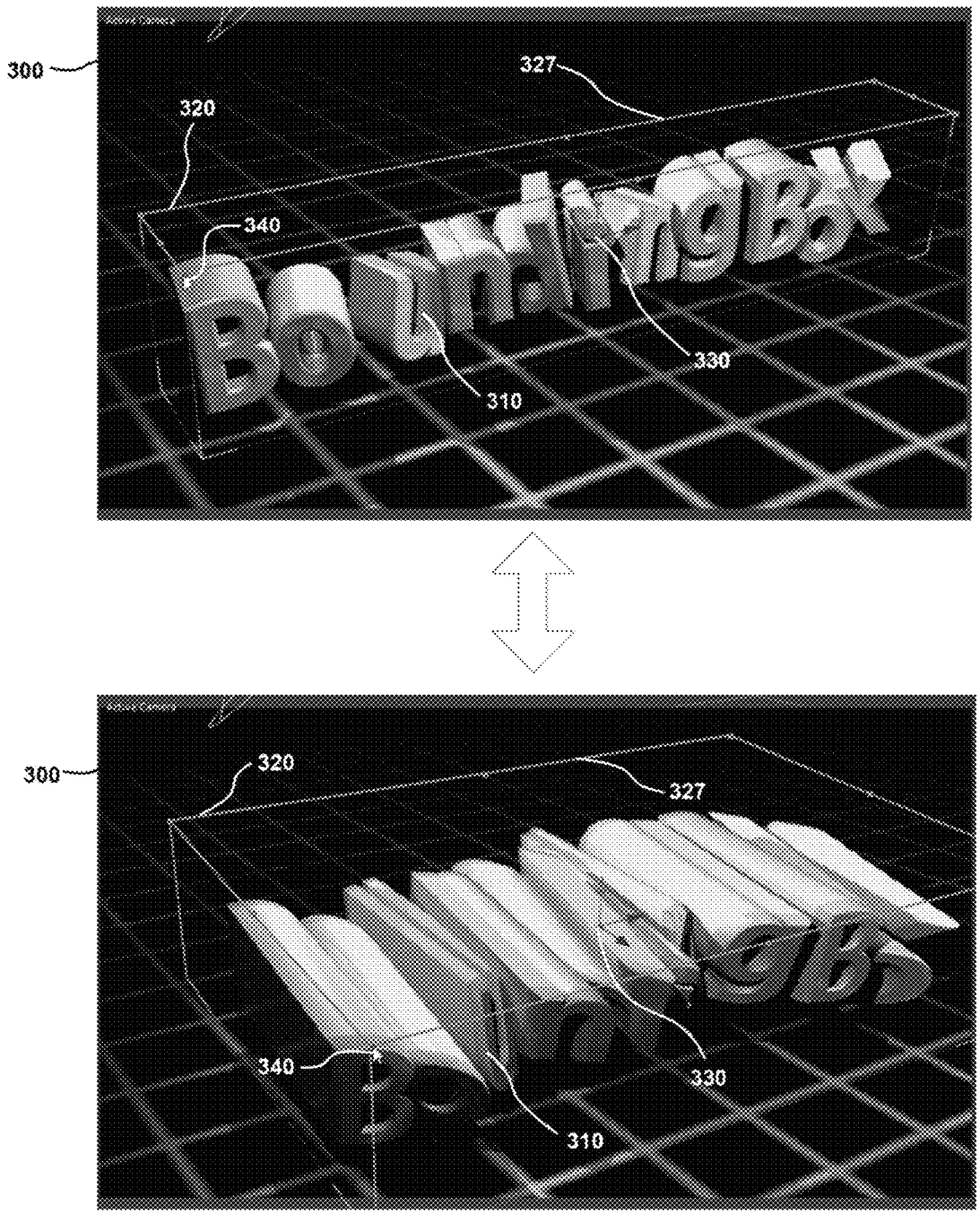

FIG. 5B illustrates another exemplary scale transformation, where the selected face 327 of the bounding box 320 is the top face. A user may select, e.g., a corner associated with the selected face 327 of the bounding box 320 with cursor 340, and drag the cursor (and selected corner) to effectuate the desired transformation. In this instance, with the selected face 327 being the top face, the user effectuates a scaling transformation, increasing and decreasing the scale of the 3D object 310 along the Z and X axes, respectively.

Figure 5C:
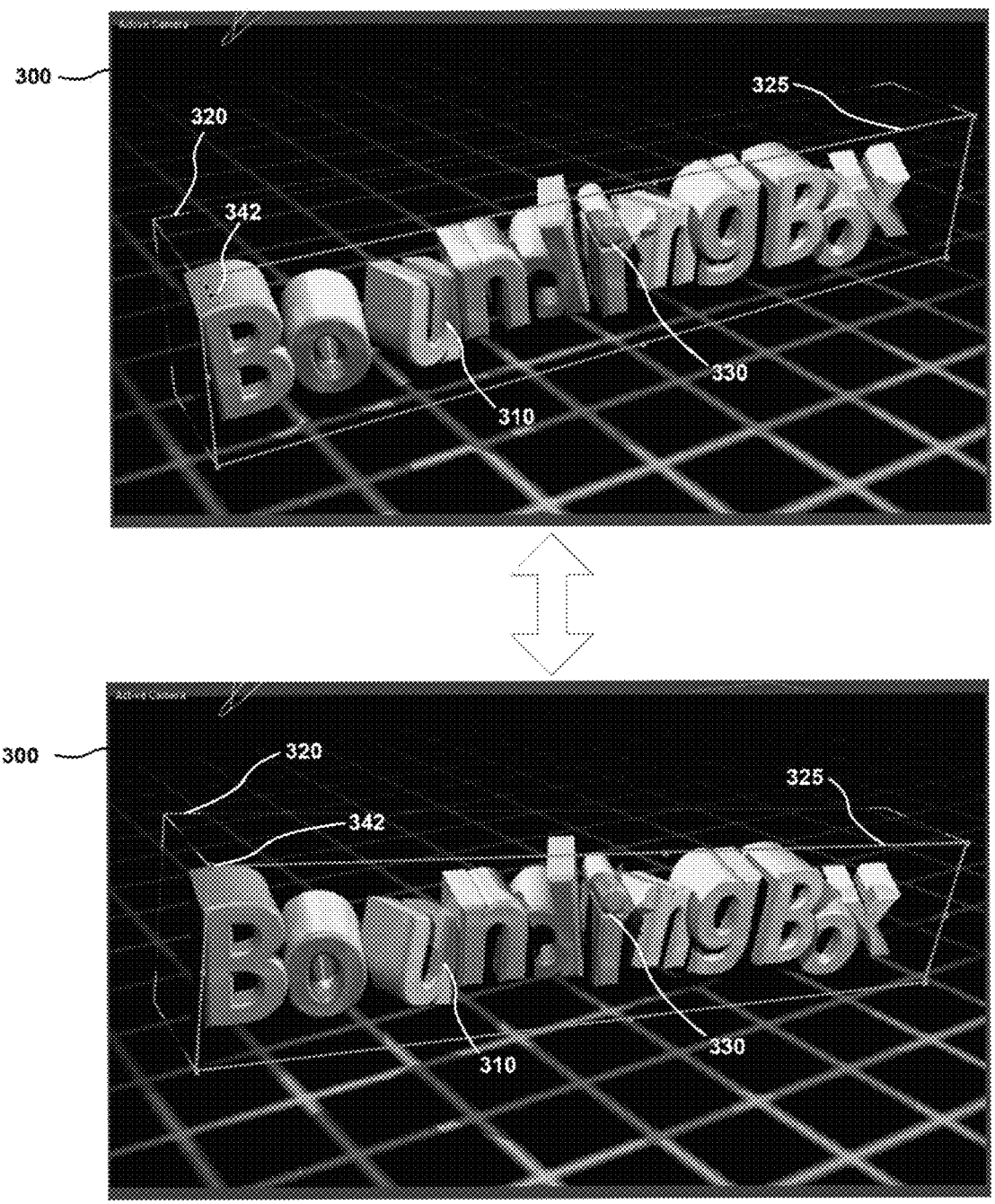
FIGS. 5C and 5D illustrate exemplary rotational transformations of a 3D object in accordance with various embodiments.
Figure 5D:
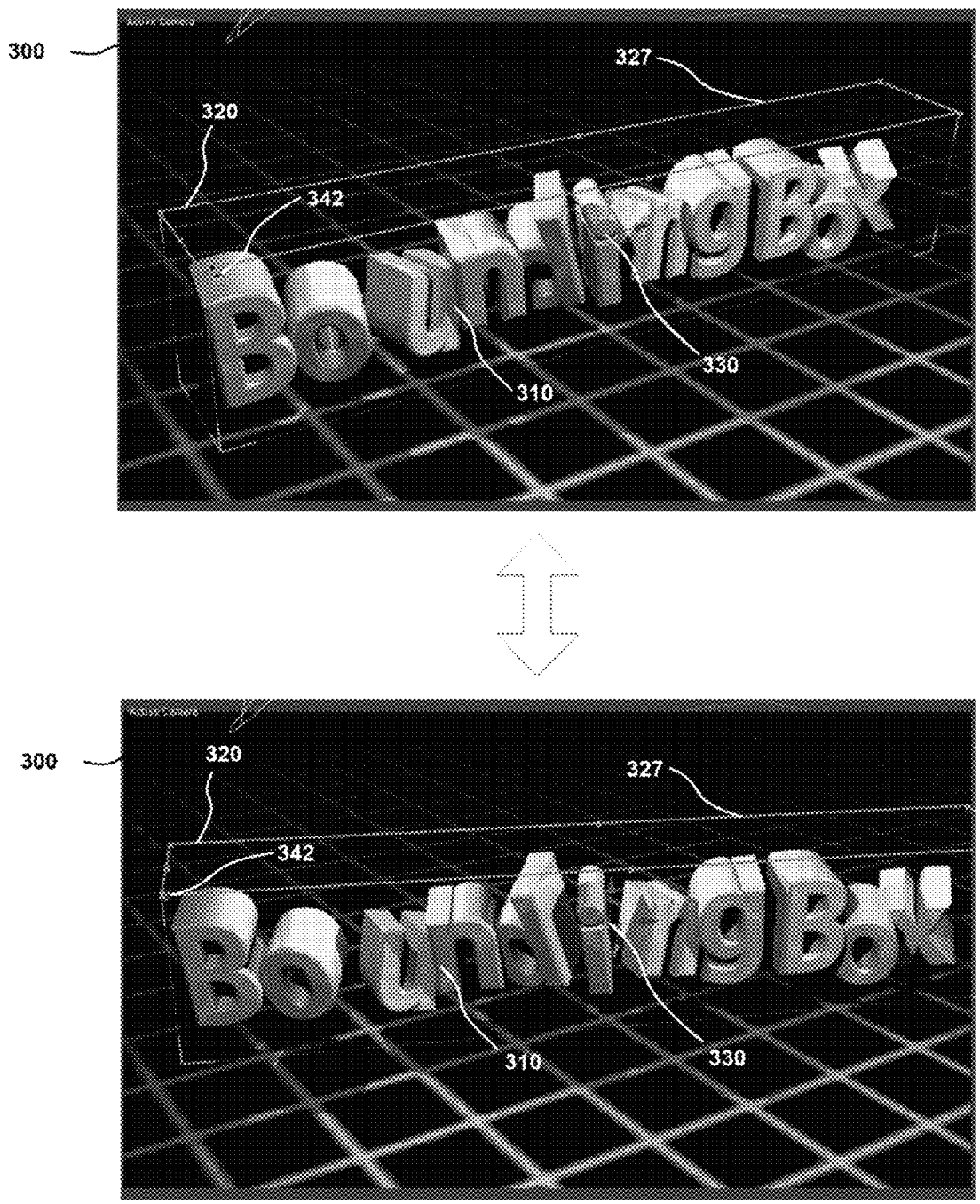

FIG. 5C illustrates an exemplary rotation transformation. In this instance, the selected face 325 is the front face of the bounding box 320. Additionally, rotation is about the Z axis about the anchor point 330. It should be noted that as yet another aid to the user, when a rotation transformation cursor 342 moves over a handle, the axis of rotation may be displayed as the cursor. Then the rotation occurs about this axis. If however, a user wants to "freely" rotate an object, the user may simply drag a selected face after, e.g., indicating that the type of transform to be performed is a rotation transformation, and the rotation will occur in all directions about the anchor point. FIG. 5D illustrates another exemplary rotation transformation, where the selected face 327 is the top face of the bounding box 320. In this instance, the rotation transformation cursor 342 appears as a Y, as rotation is about the Y axis.

Figure 5E:
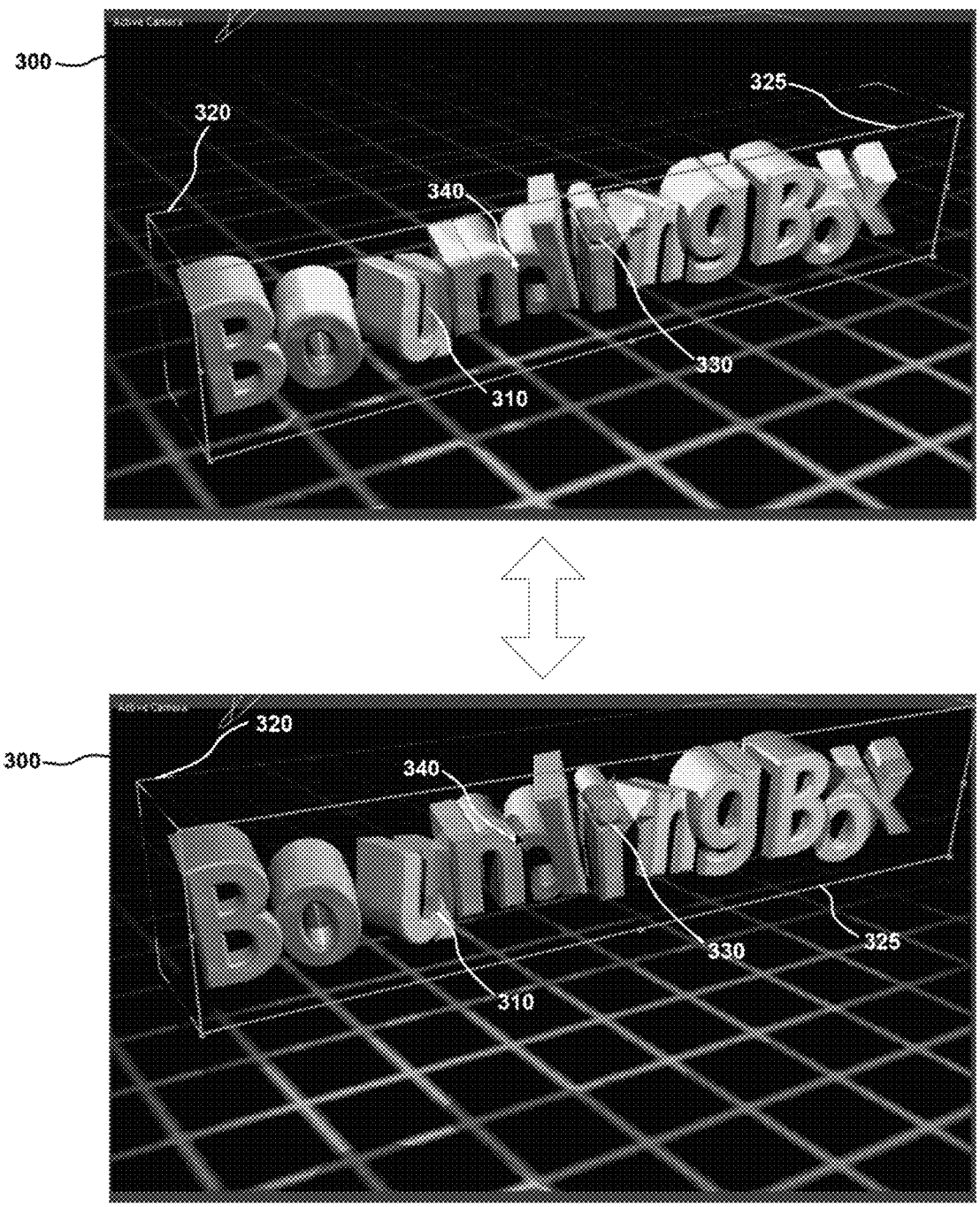
FIGS. 5E and 5F illustrate exemplary translation transformations of a 3D object in accordance with various embodiments.
Figure 5F:
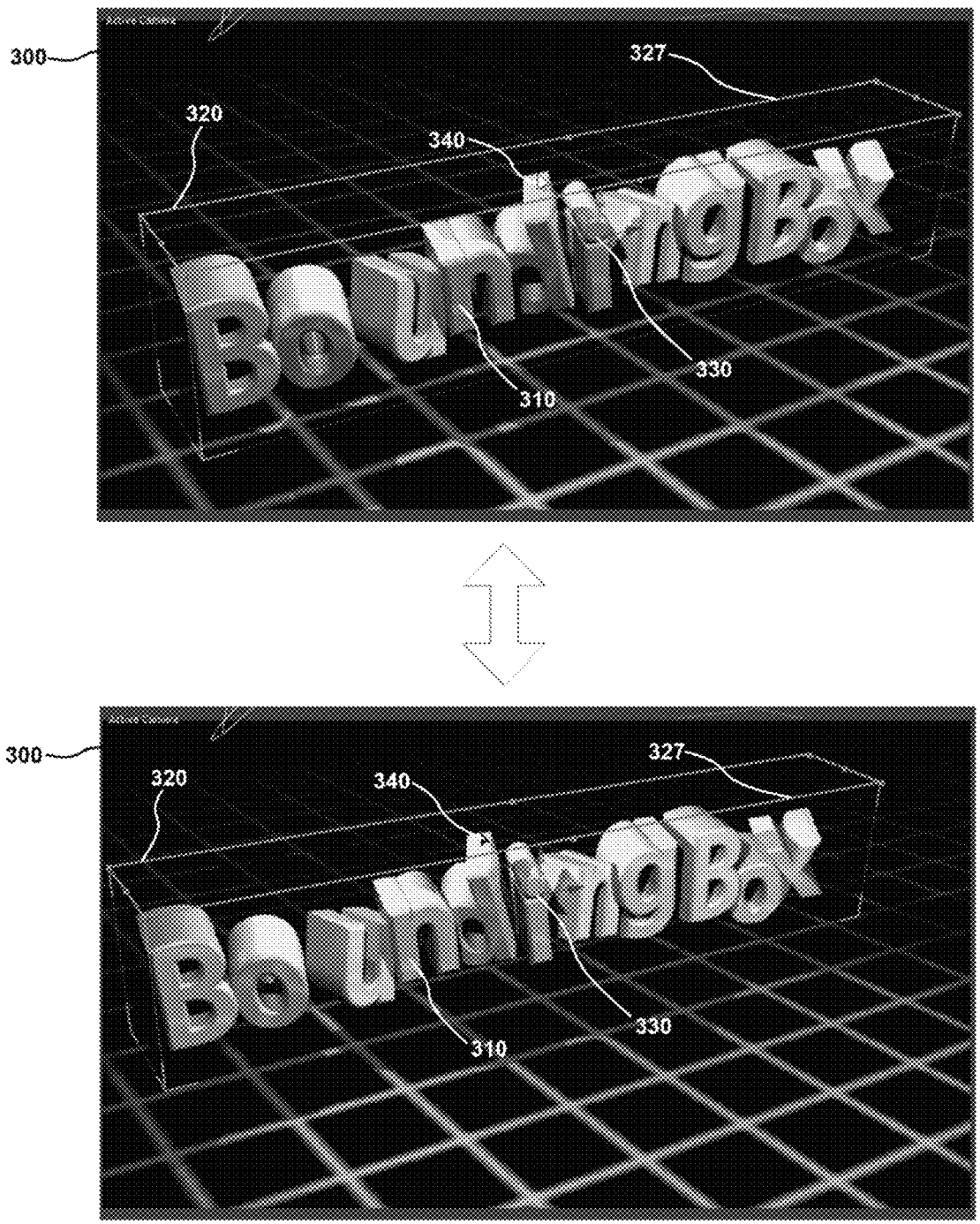

FIG. 5E illustrates an exemplary translation transformation, where the 3D object 310 is moved along the plane defined by the X and Y axes. In this instance, the selected face 325 is the front face of the bounding box 320, and a user would select and drag the 3D object 310, via cursor 340, using the selected face 325 instead of, e.g., a drag handle, as in the case of other types of transformation. FIG. 5F shows another exemplary translation transformation, where the 3D object 310 is moved along the plane defined by the X and Z axes, the selected face 327 being the top face of the bounding box 320. Similarly to the example described in FIG. 5E, a user would select and drag the 3D object 310 via cursor 340, using the selected face 327.

In accordance with various embodiments of the present disclosure, the directionality intended by a user with a simple gesture of indicating which plane a desired transformation will occur may be clearly determined. A user may therefore effectuate the manipulation of one or more 3D objects in a direct, intuitive, and efficient manner. For example, the user may directly manipulate the one or more 3D objects without any need for, e.g., manually inputting values of a desired transformation. Moreover, the direct manipulation is "relatable" to the movement of a controller, e.g., mouse, regardless of whether the mouse may be constrained to movements in the XY plane, while manipulation of a 3D object is performed "in context," i.e., in the plane of a selected bounding box face.

While various embodiments of the present disclosure have been described above for a digital media editing/creation tool or application implemented on a computer, it should be understood that they have been presented by way of example only, and not of limitation. For example, the application may be hosted on a server, and executed as a network-based application. Furthermore, the devices upon which the application/feature may be implemented can vary from standalone workstations to portable tablet devices, personal digital assistants, and the actual application/feature may encompass more or less functionality depending on the device on which it is implemented.

Likewise, the various diagrams may depict an exemplary architecture or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" or "exemplary" is used to provide exemplary instances of the item in discussion, not an exhaustive or limiting list thereof; and the terms "a" or "an" should be read as meaning "at least one," "one or more" or the like.

The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

Moreover, various embodiments described herein are described in the general context of method steps or processes, which may be implemented in one embodiment by a computer program product, embodied in, e.g., a non-transitory computer-readable memory, including computer-executable instructions, such as program code, executed by computers in networked environments. A computer-readable memory may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes. Various embodiments may comprise a computer-readable medium including computer executable instructions, which, when executed by a processor, cause an apparatus to perform the methods and processes described herein.

As used herein, the term module can describe a given unit of functionality that can be performed in accordance with one or more embodiments of the present invention. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality. Where components or modules of the invention are implemented in whole or in part using software, in one embodiment, these software elements can be implemented to operate with a computing or processing module capable of carrying out the functionality described with respect thereto.

What is claimed is:

1. A method, comprising:
    receiving a first indication specifying a three-dimensional (3D) anchor point associated with at least one 3D object;
    receiving a second indication specifying a selected face associated with the 3D object;
    determining a handle vector based on the 3D anchor point and determining a normal vector of the selected face;
    automatically determining dimensionalities of possible transformations based on dot product and cross product operations performed based on the handle vector or the normal vector and one or more coordinate axes;
    receiving, from an input mechanism, information indicative of a two-dimensional (2D) transformation associated with a 2D visual projection of the 3D object displayed on a screen;
    mapping the information to at least one of the automatically determined dimensionalities; and
    performing a 3D transformation in accordance with the information and the mapping.

2. The method of claim 1, wherein the first indication specifying the 3D anchor point indicates that the 3D anchor point is either tied to one of a plane or edge of a 2D visual projection of a bounding box about the 3D object, or remotely located away from the 3D object.

3. The method of claim 1, wherein the performance of the transformation comprises rotating the 3D object about the 3D anchor point in at least one direction commensurate with the automatically determined dimensionality.

4. The method of claim 1, wherein the performance of the 3D transformation comprises increasing or diminishing the scale of the 3D object about the 3D anchor point in at least one direction commensurate with the automatically determined dimensionality.

5. The method of claim 1, wherein the performance of the 3D transformation comprises translating the 3D object relative to the 3D anchor point in at least one direction commensurate with the automatically determined dimensionality.

6. The method of claim 1, wherein a drag handle is located at a center point of each border and at each corner of a 2D visual projection of a bounding box about the 3D object.

7. The method of claim 6, wherein the received information indicative of the transformation comprises a drag amount associated with a distance one of the drag handle or the selected face has been moved.

8. The method of claim 6, wherein movement of each of the drag handles is capable of effectuating the translation in multiple dimensionalities depending on the plane defined by the selected face.

9. The method of claim 1, wherein the automatically determined dimensionality comprises either a single defined axis or two defined axes, the either single defined axis or two defined axes being determined by executing at least one of dot product and cross product algorithms.

10. The method of claim 1, wherein the selected face comprises a face of a 2D visual projection of a bounding box about the 3D object or a mesh overlay covering the 3D object.

11. The method of claim 1, wherein the plane defined by the selected face comprises a plane of transformation upon which movement of a control mechanism is projected to effectuate the transformation.

12. A computer program product, embodied on a non-transitory computer-readable medium, comprising a software application configured to cause a processor to:
    receive a first indication specifying a three-dimensional (3D) anchor point associated with at least one 3D object;
    receive a second indication specifying a selected face of the associated with the 3D object;
    determine a handle vector based on the 3D anchor point and determine a normal vector of the selected face;
    automatically determine dimensionalities of possible transformations based on dot product and cross product operations performed based on the handle vector or the normal vector and one or more coordinate axes;

receive, from an input mechanism, information indicative of a two-dimensional (2D) transformation associated with a 2D visual projection of the 3D object displayed on a screen;

mapping the information to at least one of the automatically determined dimensionalities; and perform a 3D transformation in accordance with the information, the automatically determined dimensionality, and the 3D anchor point.

13. The computer program product of claim 12, wherein the software application is further configured to cause the processor to rotate the 3D object about the 3D anchor point in at least one direction commensurate with the automatically determined dimensionality to perform the 3D transformation.

14. The computer program product of claim 12, wherein the software application is further configured to cause the processor to increase or diminish the scale of the 3D object about the 3D anchor point in at least one direction commensurate with the automatically determined dimensionality to perform the 3D transformation.

15. The computer program product of claim 12, wherein the software application is further configured to cause the processor to translate the 3D object relative to the 3D anchor point in at least one direction commensurate with the automatically determined dimensionality to perform the 3D transformation.

16. The computer program product of claim 12, wherein the automatically determined dimensionality comprises either a single defined axis or two defined axes.

17. A method, comprising:
setting an anchor point relative to at least one three-dimensional (3D) graphical object;
determining a handle vector based on the anchor point;
defining a two-dimensional (2D) drag operation performed by a user relative to a two-dimensional (2D) visual projection of a bounding box surrounding the 3D graphical object; and
responsive to a selection of a plane, determined from the defined drag operation, in which a 3D transformation is to be performed:
determining a normal vector of the selected plane,
automatically determining dimensionalities of the 3D transformation based on dot product and cross product operations performed based on the handle vector or the normal vector and one or more coordinate axes, and
performing the 3D transformation relative to the selected plane and the anchor point.

18. The method of claim 17, wherein the defining of the drag operation further comprises determining an amount of rotation, translation, or scaling associated with the 3D transformation to be performed by determining a distance that one of a drag handle on the bounding box or the selected face is moved relative to the anchor point.

19. A computer program product, embodied on a non-transitory computer-readable medium, comprising a software application configured to cause a processor to:
set an anchor point relative to at least one three-dimensional (3D) graphical object;
determine a handle vector based on the anchor point;
define a two-dimensional (2D) drag operation performed by a user relative to a 2D visual projection of a bounding box surrounding the 3D graphical object; and
responsive to a selection of a plane, determined from the defined drag operation, in which the 3D transformation is to be performed:
determine a normal vector of the selected plane,
automatically determine dimensionalities of the 3D transformation based on dot product and cross product operations performed based on the handle vector or the normal vector and one or more coordinate axes, and
perform a 3D transformation operation relative to the selected plane and the anchor point.

20. The computer program product of claim 19, wherein the software application is further configured to cause the processor to determine an amount of rotation, translation, or scaling associated with the 3D transformation to be performed by determining a distance that one of a drag handle on the bounding box or the selected face is moved relative to the anchor point to define the drag operation.

21. A system, comprising:
an input mechanism through which an anchor point is set relative to at least one three-dimensional (3D) graphical object; and
a processor operatively connected to the input mechanism and configured to:
determine a handle vector based on the anchor point;
define a two-dimensional (2D) drag operation performed by a user via the input mechanism and relative to a 2D visual projection of a bounding box surrounding the 3D graphical object; and
responsive to a selection of a plane, determined from the defined drag operation, in which the 3D transformation is to be performed:
determine a normal vector of the selected plane,
automatically determine dimensionalities of the 3D transformation based on dot product and cross product operations performed based on the handle vector or the normal vector and one or more coordinate axes, and
perform a 3D transformation operation relative to the selected lane and the anchor point.

22. The system of claim 21, wherein the processor is further configured to determine a distance that one of a drag handle on the bounding box or the selected face is moved, via the input mechanism, relative to the anchor point to determine an amount of rotation, translation, or scaling associated with the 3D transformation to be performed.

* * * * *

UNITED STATES PATENT AND TRADEMARK OFFICE
CERTIFICATE OF CORRECTION

PATENT NO. : 9,075,933 B2  
APPLICATION NO. : 13/649930  
DATED : July 7, 2015  
INVENTOR(S) : William Amir Stone and Todd Michael Groner Kopriva Page 1 of 1

It is certified that error appears in the above-identified patent and that said Letters Patent is hereby corrected as shown below:

On the Title Page:

Beside the paragraph beginning with item "(72) Inventors:"

delete "William Aamir Stone"

Insert --William Amir Stone--

Signed and Sealed this  
Ninth Day of August, 2016

Michelle K. Lee  
*Director of the United States Patent and Trademark Office*